United States Patent
Liu et al.

(10) Patent No.: US 7,116,130 B2
(45) Date of Patent: Oct. 3, 2006

(54) METHOD AND APPARATUS FOR EFFECTIVELY RE-DOWNLOADING DATA TO A FIELD PROGRAMMABLE GATE ARRAY

(75) Inventors: Fang-Bin Liu, Taoyuan (TW); Wu-Han Yang, Kaohsiung (TW)

(73) Assignee: Benq Corporation, Taoyuan (TW)

( * ) Notice: Subject to any disclaimer, the term of this patent is extended or adjusted under 35 U.S.C. 154(b) by 293 days.

(21) Appl. No.: 10/742,663

(22) Filed: Dec. 18, 2003

(65) Prior Publication Data

US 2004/0133870 A1 Jul. 8, 2004

(30) Foreign Application Priority Data

Dec. 20, 2002 (TW) ................. 91136926 A

(51) Int. Cl.
*G06F 7/38* (2006.01)
*G06F 17/50* (2006.01)
*H03K 19/173* (2006.01)
*H03K 19/177* (2006.01)
*H03K 17/693* (2006.01)

(52) U.S. Cl. ............... 326/38; 326/37; 326/39; 326/40; 326/41; 326/47; 716/16

(58) Field of Classification Search ............ 326/37–41, 326/47; 716/16; 365/233.5
See application file for complete search history.

(56) References Cited

U.S. PATENT DOCUMENTS

| | | | |
|---|---|---|---|
| 5,831,448 A * | 11/1998 | Kean ........................... 326/41 |
| 6,211,695 B1 * | 4/2001 | Agrawal et al. .............. 326/40 |
| 6,460,094 B1 * | 10/2002 | Hanson et al. ................. 710/8 |
| 6,907,595 B1 * | 6/2005 | Curd et al. ................... 716/16 |
| 6,938,177 B1 * | 8/2005 | Blemel ....................... 713/500 |

FOREIGN PATENT DOCUMENTS

CN  1284681  2/2001

* cited by examiner

*Primary Examiner*—Rexford Barnie
*Assistant Examiner*—Dylan White
(74) *Attorney, Agent, or Firm*—Ladas & Parry LLP

(57) ABSTRACT

A method for effectively re-downloading data to a Field Programmable Gate Array (FPGA). The method uses two Complex Programmable Logic Devices (CPLDs) to implement control functions of Write-to-Non-Volatile Random Access Memory (NVRAM) and Write-to-FPGA respectively, in conjunction with a set of connectors with a detection circuit, such that according to a detection state output by the detection circuit to one CPLD implemented with Write-to-FPGA control function, a write-to-NVRAM operation for data is determined if the detection state is logic low and conversely data is written from the NVRAM to the FPGA.

10 Claims, 4 Drawing Sheets

METHOD AND APPARATUS FOR EFFECTIVELY RE-DOWNLOADING DATA TO A FIELD PROGRAMMABLE GATE ARRAY

BACKGROUND OF THE INVENTION

1. Field of the Invention

The invention relates to programmable devices, more particularly to a method and apparatus for effectively re-downloading data to a Field Programmable Gate Array (FPGA), which can easily re-configure the FPGA to increase convenience and speed in R&D and upgrade, and further save developing costs.

2. Description of the Related Art

Field Programmable Gate Arrays (FPGAs) are frequently used in multimedia, workstations, communications, networks and other applications. The appealing characteristics of FPGAs are speeds approaching those of an integrated circuit (IC) and programmability for design simulation and trial-and-error flexibility.

FPGAs are essentially configured in SRAM based mode and Anti-fuse-based mode. The SRAM based mode is widely used for IC design mode in the aforementioned applications.

The advantages for the SRAM based mode include reprogrammability, low power consumption and in-circuit configurability. However, this mode typically downloads configuration data from a host system such as a computer or workstation using an FPGA interface cable. As such, the performance for such a mode depends on joint download circuits.

FIG. 1 is a schematic diagram of an internal circuit of a typical Field Programmable Gate Array (FPGA). As shown in FIG. 1, existing download circuits generally use a Non-Volatile Random Access Memory (NVRAM) to store configuration data codes required by design circuit in the FPGA. However, such an application requires a control access circuit 16 with two functions: one for downloading external update configuration data codes to NVRAM 14 (namely Write-to-NVRAM function) and the other for writing configuration data codes in NVRAM 14 to FPGA 12 (namely Write-to-FPGA function). The cited circuits are normally integrated into a printed circuit board (PCB) 10. Thus, a user can easily change the configuration circuit in FPGA when performing R&D. When initialing mass-production, configuration data codes are directly downloaded without changing PCB circuitry. However, after mass-production is complete, the Write-to-NVRAM function is not needed. Accordingly, the circuit 16 including functions of downloading configuration data codes to NVRAM 14 and reading configuration data codes from NVRAM 14 is set aside, wasting resources. Additionally, in some products separating the two functions, when initialing mass-production, only the Write-to-FPGA function is left with operating codes. As such, the circuit 16 is removed to thus eliminate resource waste. However, as updates required by FPGA must extract NVRAM and then write new configuration data codes by existing burner or other devices, thus causing inconvenience in R&D and difficulty in upgrade.

SUMMARY OF THE INVENTION

It is an object of the present invention to provide a method for effectively re-downloading data to a Field Programmable Gate Array (FPGA), which easily re-configures the FPGA to increase convenience and speed in R&D and upgrade, thereby further saving development costs.

The present invention is generally directed to a method for effectively re-downloading data to a Field Programmable Gate Array (FPGA), which has a feature of repeated on-board data download to FPGA such that convenience in R&D is increased and further product upgrade speed is increased. The method includes using two Complex Programmable Logic Devices (CPLDs) to implement control functions of Write-to-Non-Volatile Random Access Memory (NVRAM) and Write-to-FPGA respectively, in conjunction with a set of connectors with a detection circuit such that according to a detection state output by the detection circuit to the one CPLD implementing Write-to-FPGA control function, a write-to-NVRAM operation for data is determined if the detection state is logic low and conversely data is written from the NVRAM to the FPGA. Thus, repeated on-board data download to FPGA is obtained and has re-configuration convenience and performance.

DESCRIPTION OF THE DRAWINGS

The present invention will be described by way of exemplary embodiments, but not limitations, illustrated in the accompanying drawings in which like references denote similar elements, and in which.

DETAILED DESCRIPTION OF THE INVENTION

Figure 1:
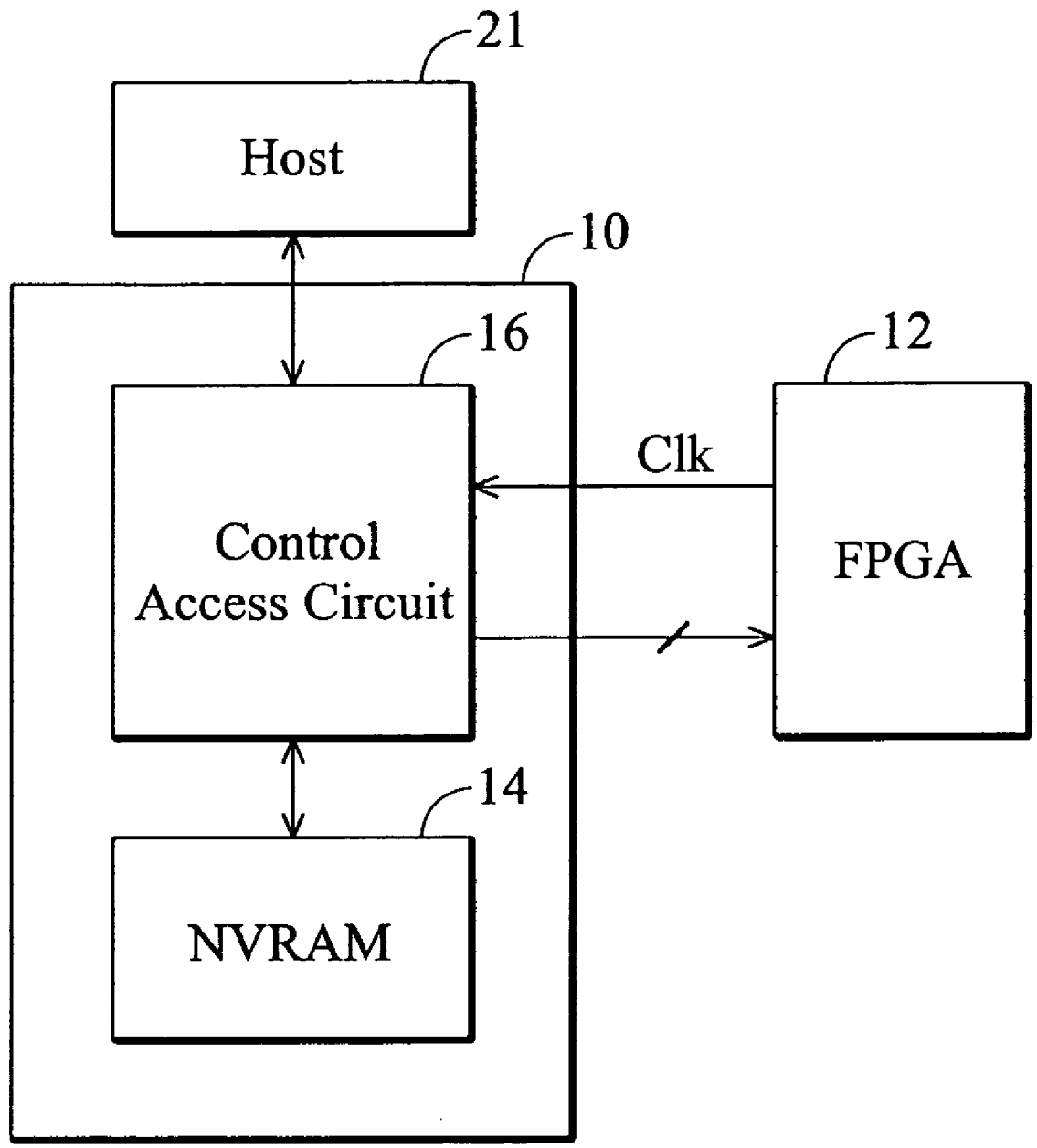
FIG. 1 is a block diagram of a typical Field Programmable Gate Array (FPGA) download circuit.
Figure 2:
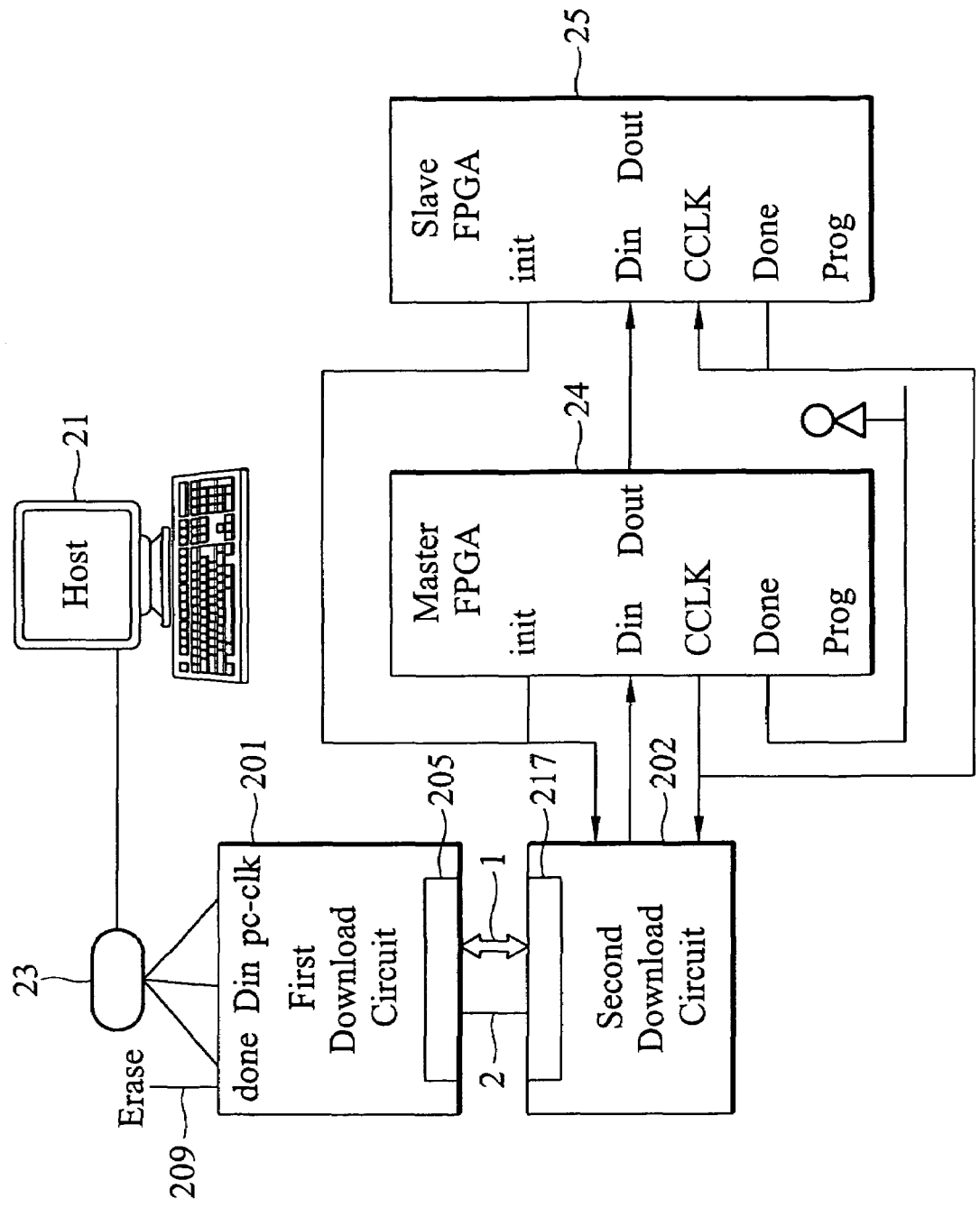
FIG. 2 is a block diagram of an FPGA download system according to the invention.

FIG. 2 is a block diagram of a Field Programmable Gate Array (FPGA) download system according to the invention. In FIG. 2, the system essentially includes a first download circuit 201 and a second download circuit 202. The first download circuit 201 transfers information for updating data on the download side and provides a control signal for controlling download procedure. The second download circuit 202 receives the information from the first download circuit 201 and write the information into a Non-Volatile Random Access Memory (NVRAM) (described later). The NVRAM can be a flash memory. After external data is written in the NVRAM to complete configuration data code update, the updated information is then written in a master FPGA 24. The master FPGA can convert the information (from a host 21 through an interface 23) into a format to be accepted and used by a slave FPGA.

As shown in FIG. 2, if data is downloaded from the host 21, the data is transferred to the device 202 through a control line 2 and a data bus 1. When a Write-to-FPGA occurs, the data is transferred in acceptable and usable format from the device 202 to the device 24. If more FPGAs are connected to the device 24, the data is sequentially transferred to the FPGAs. When an update or test requirement for the device 24 or 25 content occurs, a first connector 205 is connected to a second connector 217 to transfer the control right from the device 202 to the device 201 through the control line 2. At this point, an external signal Erase is input through a pin 209 and a control signal is delivered by a host 21 through an interface 23 to, for example, a pin of the device 201 firstly, to erase existing NVRAM content and then pins Din, pc-clk and connectors 205, 217 to directly write new data into the NVRAM. The devices 201 and 202 are further described in the following.

Figure 3:
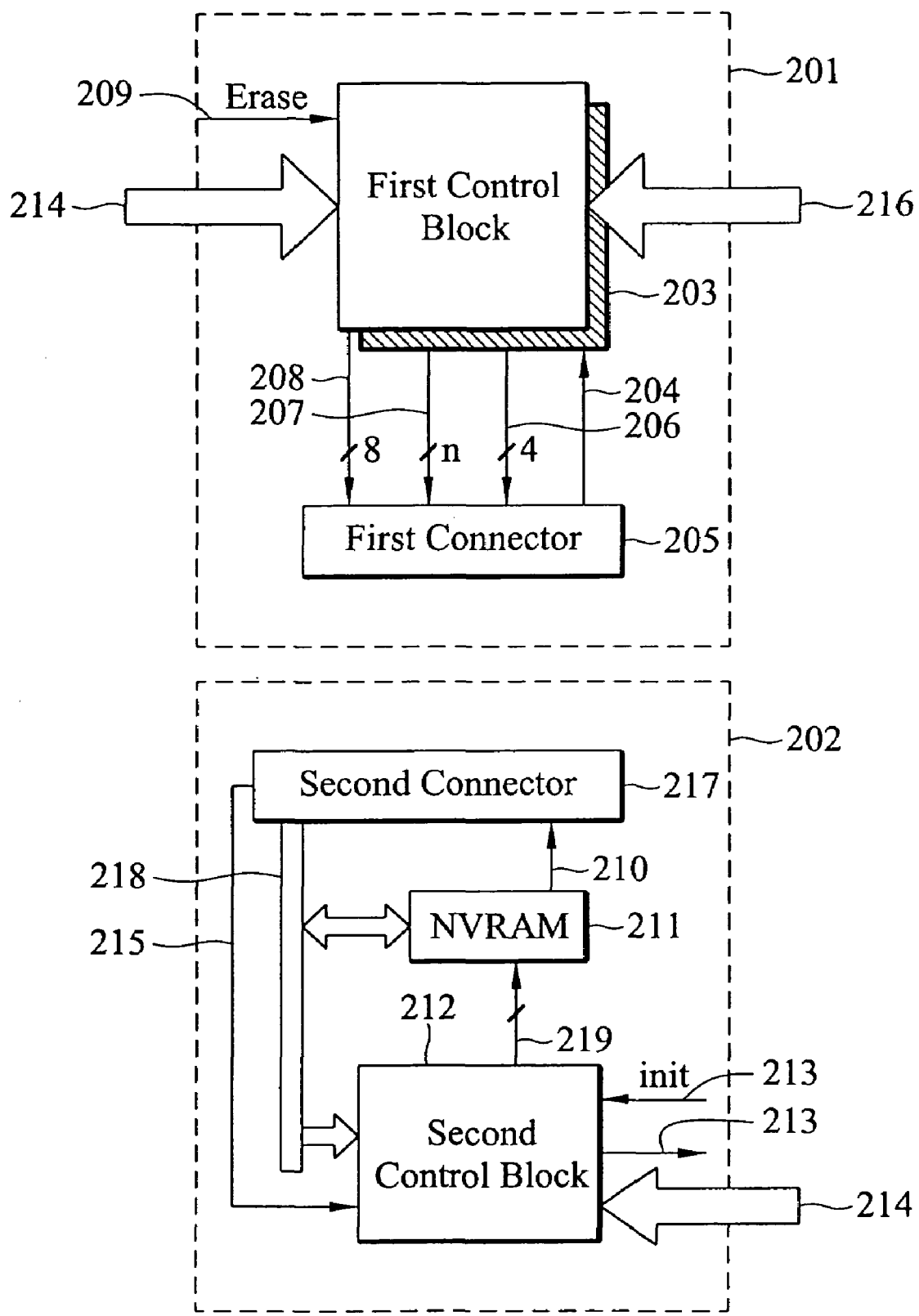
FIG. 3 is an embodiment of a download circuit according to FIG. 2 of the invention.

FIG. 3 shows an embodiment of the devices 201 and 202 1S of FIG. 2 according to the invention. In FIG. 3, the device 201 essentially includes a first control block and a first connector 205, and the device 202 essentially includes a second connector 217, an NVRAM 211 and a second control block 212. The devices 201 and 202 are two independent units and communicate with each other through the built-in connectors 205 and 217 respectively.

As shown in FIG. 3, this embodiment adds a detection circuit (described later) and separates FPGA download circuit into the Write-to-NVRAM (first) download circuit 201 and the Write-to-FPGA (second) download circuit 202 for both cost efficiency and design convenience. The control blocks 203 and 212 are implemented by two Complex Programmable Logic Devices (CPLDs), wherein that for the block 203 requires larger capacity than that for the block 212. The two devices 201 and 202 are connected by the built-in connectors 205 and 217 with n+13 pins, wherein n is bit number of address bus 207 for NVRAM 211 write, and 13 pins respectively represent 8-bit data bus 208, 4-bit control signal (including a chip enable signal (ce) pin, an output enable signal (oe) pin, a write enable signal pin, and a detection state signal pin 215 for a detection state signal 206 of the detection circuit), and a clock signal pin 204. The devices 201 and 202 use the corresponding CPLD download pins 214 to enable download action such that the download cable transfers configuration data codes to be written in the NVRAM 211 from the host 21 (FIG. 2) to the device 201 or serially transmits configuration data codes stored in the NVRAM 211 to the FPGAs 24 and 25 (FIG. 2) through initialized block 212, wherein initialized action for the block 212 (initialized block) is completed by initializing an initialization signal init (through a pin 213) from the device 24 to the block 212 and the device 25. In addition, circuit synchronization in this case is performed by sending a master clock signal CCLK (FIG. 2) from the device 24 to clock pins 204, 210 of all devices. The device 212 can access the device 211 through a control pin 219 for receiving control signals from the device 24 to the device 202. Access action for the NVRAM 211 is performed by a bi-directional bus 218. Upon the cited separate connectors 205 and 217, data-readout for the NVRAM 211 can be independently performed. However, data write to the NVRAM 211 is dependent on the pin 215 of the detection circuit to signal the device 212 floating all data and pins as a high impedance state. The detection circuit built in the connectors is further described in the following.

Figure 4:
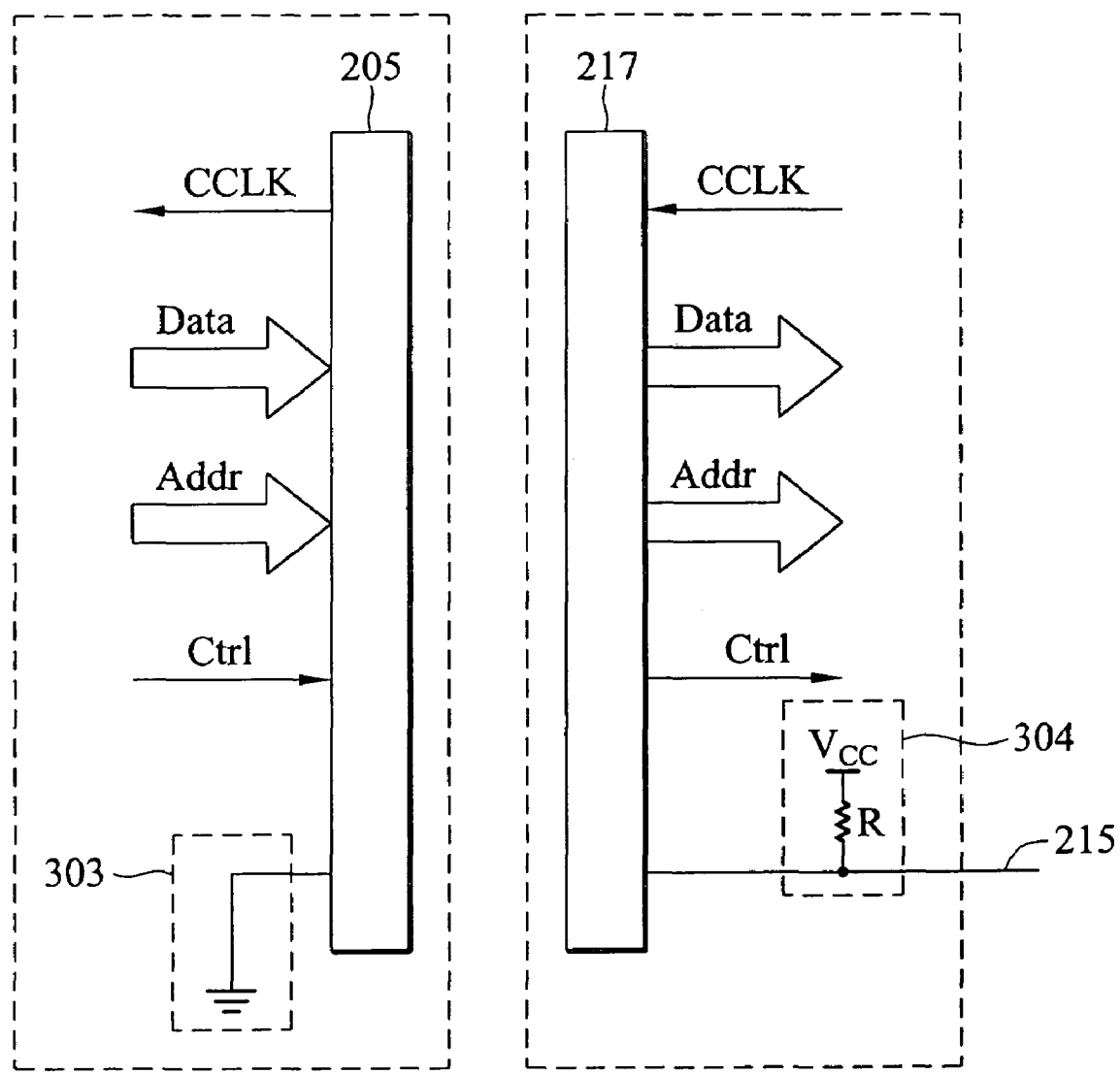
FIG. 4 is a schematic diagram of interior circuit of connectors according to FIG. 3 of the invention.

FIG. 4 is a schematic diagram of the interior of the separate connectors of FIG. 3 according to the invention. In FIG. 4, the separate connectors include the detection circuit 303, 304 respectively implemented on the separate connector in addition to pins of signals CCLK, Data, Addr and Ctrl shown in FIG. 3 for electrical connection.

As shown in FIG. 4, the detection circuit includes a grounded shorted-circuit pin 303 implemented on the connector 205 (as a daughter board) side and a detection resistor R with about 10 K Ohm implemented between the pin 215 and an operating voltage VCC on the connector 217 (as a mother board) side. Thus, when the connectors 205 and 217 are disconnected, the pin 215 is in an open state with logic 1 (high potential). In contrast, when the connectors are connected, the pin 215 presents a closed state with logic 0 (low potential) to form a pathway. Accordingly, data flow direction is determined, i.e. The direction flowing from/to the device 21. Briefly, data is read from the device 211 to the device 24 when the pin 215 outputs high potential and conversely data is written into the device 211.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for re-downloading data to a Field Programmable Gate Array (FPGA), characterized by use of Complex Programmable Logic Devices (CPLDs) to implement control functions of Write-to-Non-Volatile Random Access Memory (NVRAM) and Write-to-FPGA respectively, in conjunction with a set of connectors with a detection circuit to determine if the CPLDs use the set of connectors to download data according to a detection state output by the detection circuit to one CPLD implemented with Write-to-FPGA control function, wherein a write-to-NVRAM operation for data is determined when the detection state is a first logic level and data is written from the NVRAM to the FPGA when the detection state is a second logic level.

2. The method according to claim 1, wherein the one CPLD implemented with Write-to-NVRAM control function has larger capacity than the other CPLD implemented with Write-to-FPGA control function.

3. The method according to claim 1, wherein a part of the detection circuit implements a resistor between an external operating voltage and a detection signal pin to output the detection state through the detection signal pin to the CPLD implemented with Write-to-FPGA control function, and another part of the detection circuit is implemented with a grounded shorted-circuit, to form an open circuit when the CPLDs are disconnected, thus outputting the detection state with a high potential as the first logic level, or to form a pathway when the CPLDs are connected, thus outputting the detection state with a low potential as the second logic level.

4. The method according to claim 3, wherein the grounded shorted-circuit is implemented by a wire.

5. An apparatus for re-downloading data to a Field Programmable Gate Array (FPGA), comprising:
   a Non-Volatile Random Access Memory (NVRAM);
   a first control block, having a first Complex Programmable Logic Device (CPLD) implementing a control function of receiving and writing a reconfiguration data code to the NVRAM;
   a first connector with a first detection circuit, connected to the first control block to receive the reconfiguration data code;
   a second control block, having a second CPLD implementing a control function of reading the reconfiguration data code from the NVRAM and writing the reconfiguration data code to an FPGA; and
   a second connector with a second detection circuit, connected to the second control block to transfer a detection state to the second control block, the second connector optionally connected to or disconnected from the first connector,
   wherein when the first connector and the second connector are separate, the detection state presents a first potential such that the second control block reads the reconfiguration data code stored in the NVRAM and writes the reconfiguration data code into an FPGA; when the first connector and the second connector are connected to connect the first detection circuit and the second detection circuit, the detection state presents a second-potential such that the first control block writes the reconfiguration data code into the NVRAM.

6. The apparatus according to claim 5, wherein the first control block has pins to receive external control signals including a chip enable signal to enable corresponding circuits, an output enable signal to enable data and signal output, a write enable signal to enable data code to be written into the NVRAM and a detection state signal to transfer and accordingly determine data code to be read from or written into the NVRAM.

7. The apparatus according to claim 5, wherein the second control block has a pin to receive a clock signal from the FPGA for clock synchronization of corresponding devices.

8. The apparatus according to claim 5, wherein the first detection circuit is a grounded wire and the second detection circuit is a resistor with a first end connected to an external voltage and a second end connected to a line of transferring the detection signal to the second block such that the second end is connected to the grounded wire when the first connector and the second connector are connected.

9. The apparatus according to claim 7, wherein the corresponding devices comprise the NVRAM, the first control block and the second control block.

10. The apparatus according to claim 5, wherein the first potential is a high potential and the second potential is a low potential.

* * * * *